United States Patent
Loiko et al.

(10) Patent No.: US 9,331,160 B2
(45) Date of Patent: May 3, 2016

(54) SPLIT-GATE NON-VOLATILE MEMORY CELLS HAVING GAP PROTECTION ZONES

(71) Applicants: Konstantin V. Loiko, Austin, TX (US); Spencer E. Williams, Austin, TX (US); Brian A. Winstead, Austin, TX (US)

(72) Inventors: Konstantin V. Loiko, Austin, TX (US); Spencer E. Williams, Austin, TX (US); Brian A. Winstead, Austin, TX (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 0 days.

(21) Appl. No.: 13/970,796

(22) Filed: Aug. 20, 2013

(65) Prior Publication Data

US 2015/0054048 A1    Feb. 26, 2015

(51) Int. Cl.
| | |
|---|---|
| H01L 21/336 | (2006.01) |
| H01L 29/788 | (2006.01) |
| H01L 29/423 | (2006.01) |
| H01L 29/792 | (2006.01) |
| H01L 29/66 | (2006.01) |

(52) U.S. Cl.
CPC .... *H01L 29/42328* (2013.01); *H01L 29/42332* (2013.01); *H01L 29/42344* (2013.01); *H01L 29/66825* (2013.01); *H01L 29/66833* (2013.01); *H01L 29/7881* (2013.01); *H01L 29/792* (2013.01)

(58) Field of Classification Search
CPC ............ H01L 29/42328; H01L 29/788; H01L 29/792; H01L 29/42364; H01L 29/66825; H01L 29/66833; H01L 29/42344
See application file for complete search history.

(56) References Cited

U.S. PATENT DOCUMENTS

| | | | | |
|---|---|---|---|---|
| 6,538,275 | B2 * | 3/2003 | Sugiyama | ......... H01L 21/28273 257/314 |
| 6,545,312 | B2 * | 4/2003 | Kusumi | ............ H01L 21/28273 257/315 |
| 7,087,955 | B2 * | 8/2006 | Kawashima | ...... H01L 21/28273 257/315 |
| 7,811,886 | B2 | 10/2010 | Winstead et al. | |
| 7,985,649 | B1 | 7/2011 | Winstead et al. | |
| 8,035,156 | B2 | 10/2011 | Winstead et al. | |
| 8,263,463 | B2 | 9/2012 | Kang et al. | |

* cited by examiner

*Primary Examiner* — Stephen W Smoot
*Assistant Examiner* — Vicki B Booker (57) ABSTRACT

Split-gate non-volatile memory (NVM) cells having gap protection zones are disclosed along with related manufacturing methods. After formation of a gate for a split-gate NVM cell over a substrate, a doped region is formed adjacent the gate. A first portion of the doped region is then removed to leave a second portion of the doped region that forms a gap protection zone adjacent the gate. For some disclosed embodiments, a select gate is formed before a control gate. For other disclosed embodiments, the control gate is formed before the select gate. The gap protection zones can be formed, for example, using an etch processing step to remove the desired portions of the doped region, and a spacer can also be used to protect the gap protection zone during this etch processing step. Related NVM systems are also disclosed.

14 Claims, 7 Drawing Sheets

SPLIT-GATE NON-VOLATILE MEMORY CELLS HAVING GAP PROTECTION ZONES

TECHNICAL FIELD

This disclosure relates generally to non-volatile memory (NVM) systems, and more specifically, to split-gate NVM cells and forming split-gate NVM cells.

BACKGROUND

Prior programmable memories have been implemented using split-gate non-volatile memory (NVM) cells. While it is desirable to shrink device geometries for such split-gate NVM cells, high resistance between control gates and underlying channels for split-gate NVM cells can become problematic for NVM system performance.

Figure 1:
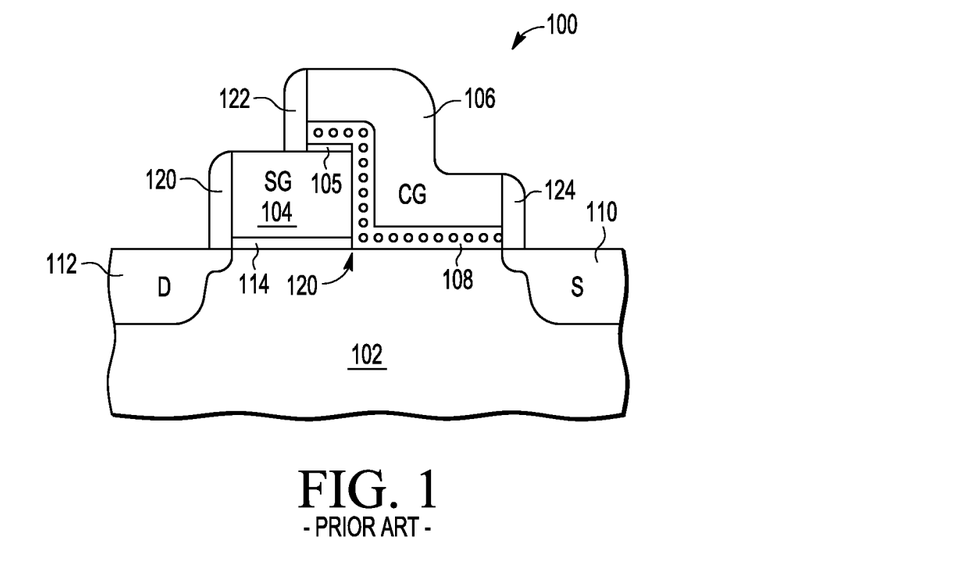

FIG. 1 (Prior Art) is a cross-section view of an embodiment 100 for a prior split-gate NVM cell. A select gate (SG) 104, a charge storage layer 108, and a control gate (CG) 106 have been formed over a substrate 102 along with select-gate dielectric layer 114 and protective nitride layer 105. Source (S) region 110 and drain (D) region 112, as well as spacers 120, 122, and 124, have also been formed. During operation, particularly as device geometries are reduced, high resistance (e.g., reduced transconductance) can occur between the corner of the control gate 106 and the underlying channel next to the select gate 104 as indicated by arrow 120. This reduced transconductance can cause undesirable performance degradation of the NVM system.

Figure 11:
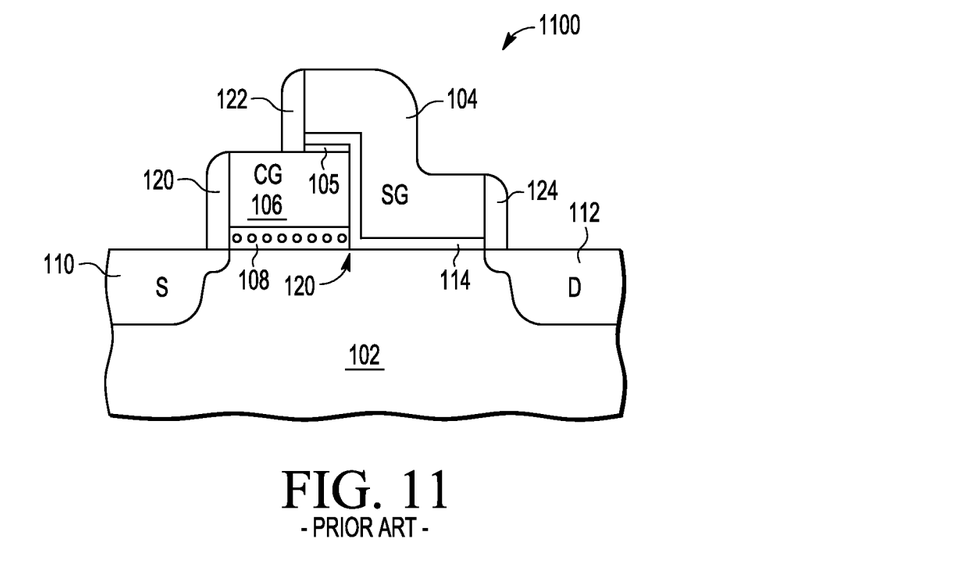
FIG. 11 (Prior Art) is a cross-section view of an embodiment for a prior split-gate NVM (non-volatile memory) cell where the control gate is formed prior to the select gate.

FIG. 11 (Prior Art) is a cross-section view of an embodiment 1100 for a prior split-gate NVM cell where the control gate (CG) 106 is formed prior to forming the select gate (SG) 104. A control gate (CG) 106, a charge storage layer 108, and a select gate (SG) 104 have been formed over a substrate 102 along with a select-gate dielectric layer 114 and protective nitride layer 105. Source (S) region 110 and drain (D) region 112, as well as spacers 120, 122, and 124, have also been formed. During operation, particularly as device geometries are reduced, high resistance (e.g., reduced transconductance) can occur between the corner of the select gate 104 and the underlying channel next to the control gate 106 as indicated by arrow 120. This reduced transconductance can cause undesirable performance degradation of the NVM system.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale FIG. 1 (Prior Art) is a cross-section view of an embodiment for a prior split-gate NVM (non-volatile memory) cell.

DETAILED DESCRIPTION

Split-gate non-volatile memory (NVM) cells having gap protection zones are disclosed along with related manufacturing methods. After formation of a gate for a split-gate NVM cell over a substrate, a doped region is formed adjacent the gate. A first portion of the doped region is then removed to leave a second portion of the doped region that forms a gap protection zone adjacent the select gate. For some disclosed embodiments, a select gate for a split-gate NVM cell is formed before a control gate for the split-gate NVM cell. After formation of the select gate and the gap protection zone for these embodiments, a charge storage layer and a control gate are then formed over the substrate, along with drain and source regions, to complete the split-gate NVM cell. For other disclosed embodiments, the control gate for the split-gate NVM cell is formed before the select gate for the split-gate NVM cell. The gap protection zones can be formed, for example, using an etch processing step to remove the desired portions of the doped region, and a spacer can also be used to protect the gap protection zone during this etch processing step. Different and/or additional processing steps can also be utilized while still providing the gap protection zone for split-gate NVM cells and related NVM systems.

Figure 2:
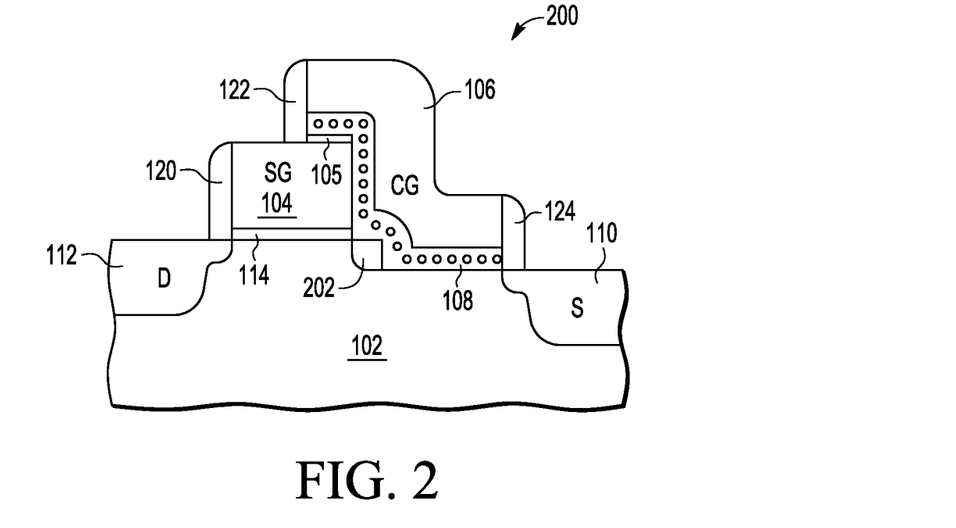
FIG. 2 is a cross-section view of an embodiment for a split-gate NVM cell having a gap protection zone.

FIG. 2 is a cross-section view of an embodiment 200 for a split-gate NVM cell having a gap protection zone 202. As with embodiment 100 in FIG. 1 (Prior Art), a select gate (SG) 104, a charge storage layer 108, and a control gate (CG) 106 have been formed over a substrate 102 along with a select-gate dielectric layer 114 and protective nitride layer 105.

Source (S) region 110 and drain (D) region 112, as well as spacers 120, 122, and 124, have also been formed. However, unlike embodiment 100 of FIG. 1 (Prior Art), embodiment 200 includes a gap protection zone 202, which can be formed using various processing techniques as described herein. As also described herein, the gap protection zone 202 is preferably a heavily-doped region that provides lower resistance (i.e., improves transconductance), thereby improving performance of the NVM system.

It is noted that the semiconductor substrate 102 described herein can be any desired semiconductor material or combinations of materials, such as gallium arsenide, silicon germanium, silicon, monocrystalline silicon, other semiconductor materials, and combinations of these semiconductor materials. It is also noted that the semiconductor substrate 102 represents the top portion of a semiconductor substrate. It is further noted that the semiconductor substrate 102 described herein could be formed on top of other substrate materials including a separate non-semiconductor material, if desired, such as thin film semiconductor substrates formed on other semiconductor or non-semiconductor materials. Further, it is noted that while split-gate NVM cells are shown, other NVM cell types could also be utilized, such as floating gate NVM cells, other discrete charge storage NVM cells, and/or other desired NVM cells. Further variations could also be implemented, as desired.

It is further noted that the charge storage layer 108 can be formed, for example, using silicon nanocrystals, metal nanoclusters, nitride or some other desired discrete charge storage material. It is further noted that the charge storage layer can also be a continuous charge storage layer, if desired, such as a floating gate charge storage layer formed using polysilicon layers, oxide-nitride-oxide layers, or layers of other desired materials. Other charge storage layers could also be used for, if desired.

Figure 7:
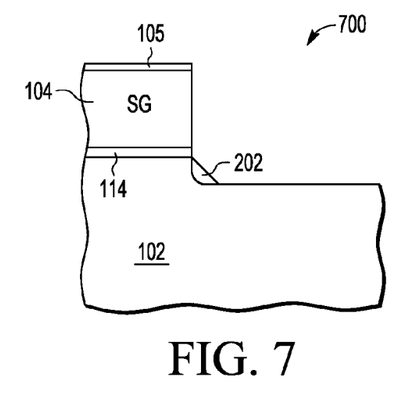
FIG. 7 is a cross-section view of a further example embodiment where a spacer is not used after the implant processing step of FIG. 3.
Figure 8:
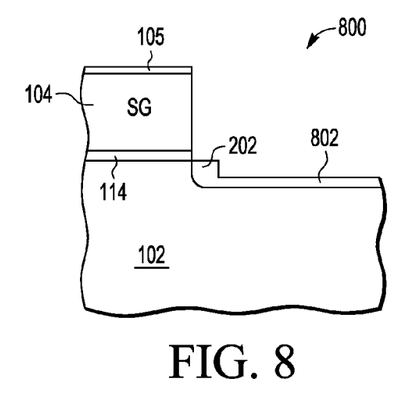
FIG. 8 is a cross-section view of a further example embodiment where a doped tail region is left after the etch processing step of FIG. 5.
Figure 9:
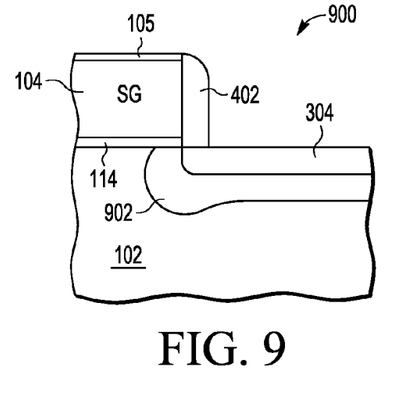
FIG. 9 is a cross-section view of a further example embodiment where a halo processing step is utilized prior to formation of the doped region in FIG. 3.
Figure 10:
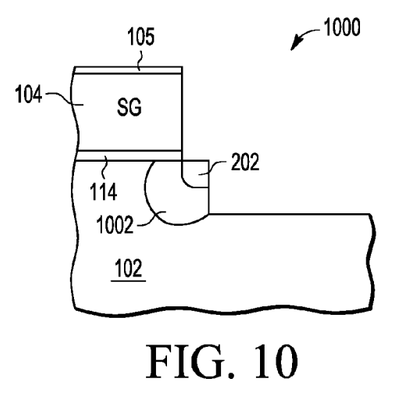
FIG. 10 is a cross-section view of an example embodiment after etch processing steps have been applied to the structure of FIG. 9 to leave a doped halo region below the gap protection zone.
Figure 19:
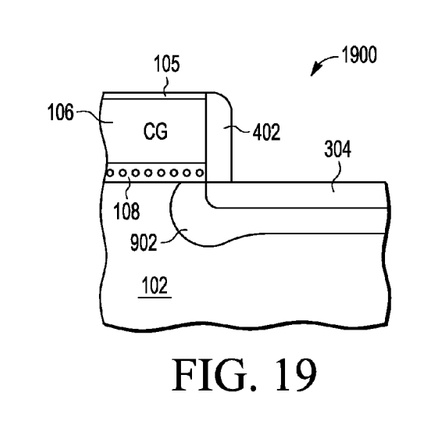
Figure 20:
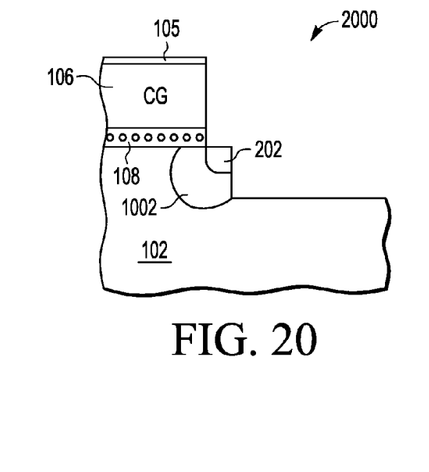
Figure 21:
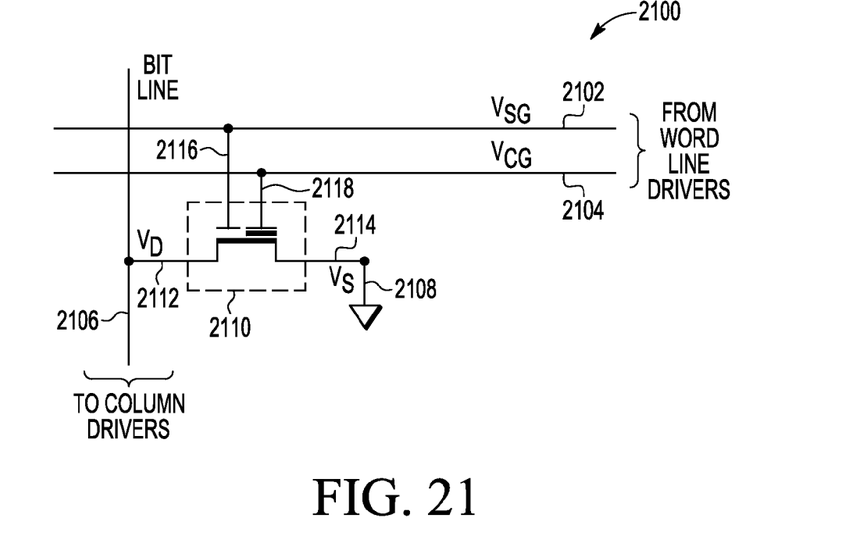
FIG. 21 is a diagram of an embodiment for connections associated with a split-gate NVM cell having a heavily-doped gap protection zone.
Figure 22:
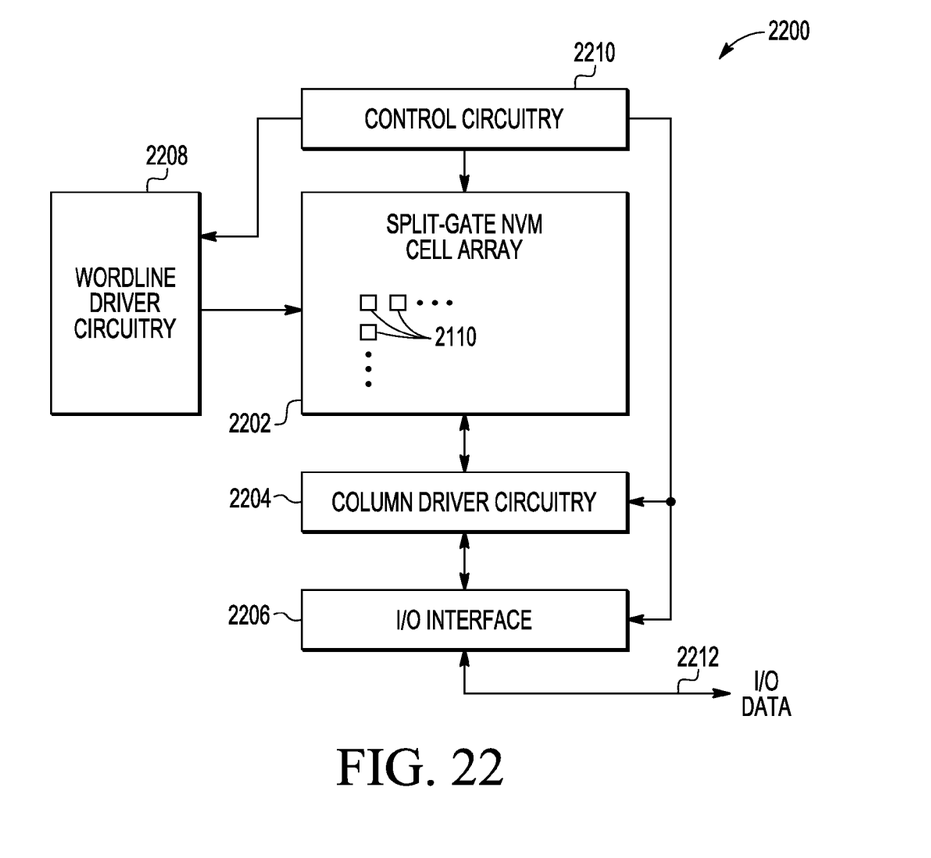
FIG. 22 is a block diagram of an embodiment for a split-gate NVM system including a memory cell array having a plurality of split-gate NVM cells, each having a heavily-doped gap protection zone.

Various processing techniques can be utilized to form the gap protection zone 202. Example techniques are now described with respect to FIGS. 3-10. FIGS. 3-6 provide example processing steps using implant, spacer, and etch processing steps to form the gap protection zone 202. FIG. 7 provides a further example embodiment where the spacer is not used. FIG. 8 provides a further example embodiment where a doped tail region is left after the etch processing step. FIGS. 9-10 provide further example processing steps where a halo processing step is utilized prior to formation of the gap protection zone 202. It is noted that additional and/or different processing steps could be utilized, as desired, to form the gap protection zone 202. FIGS. 12-20 provide similar diagrams as shown in FIGS. 2-10 except the control gate is formed prior to the select gate in FIGS. 12-20. FIGS. 21-22 provide a diagram for connections to a split-gate cell and a block diagram for a related NVM system, respectively.

Figure 3:
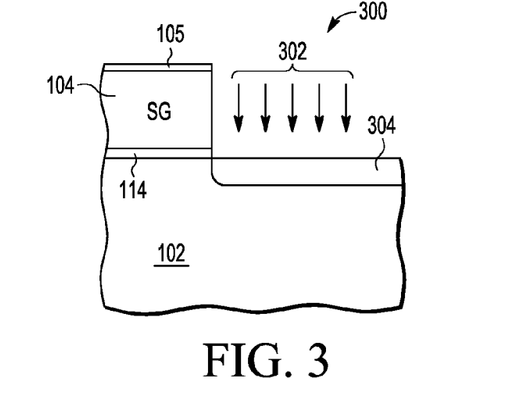
FIG. 3 is a cross-section view of an embodiment for an implant processing step after formation of a select gate for a split-gate NVM cell.

Now looking to FIG. 3, a cross-section view is provided of an embodiment 300 for an implant processing step 302 after formation of a select gate 104 for a split-gate NVM cell. As depicted, the select gate 104 has been formed over substrate 102 along with select-gate dielectric layer 114 and protective nitride layer 105. An implant 302 is used to form a doped region 304 within the substrate 102. It is noted that the implant processing step can be an ion implant, and it is further noted that the resulting doped region 304 preferably has an average impurity content above about $1 \times 10^{18}$ atoms per cubic centimeter to make the doped region 304 a heavily doped region. The doped region 304 could also be formed using different and/or additional processing steps, as desired. As indicated above, the substrate 102 can be a variety of materials, including monocrystalline silicon.

For one embodiment, the doped region 304 is n-type, and the substrate 102 is p-type. The ion implant may be an n-type ion implant, such as an arsenic ion implant, performed using an energy range of 1 to 10 keV (kilo-electron volt) and a dose of $1 \times 10^{13}$ to $1 \times 10^{14}$ atoms per square centimeter. It is further noted that other n-type dopants could also be utilized for the implant, such as for example, phosphorous, antimony, or another desired n-type dopant. The p-type substrate 102 can be doped with boron at concentration levels ranging from $5 \times 10^{14}$ to $1 \times 10^{16}$ atoms per cubic centimeter and can be a p-type well, if desired. The p-type dopant for the substrate 102 can be, for example, boron, indium, or another desired p-type dopant. For this example embodiment, it is assumed that electrons would be used as the majority carrier for bitcell operations for the resulting NVM cell. For another example embodiment, the p-type and n-type dopants can be switched, such that the doped region 304 is p-type, and the substrate 102 is n-type. For this additional embodiment, it is assumed that holes are the majority carrier for bitcell operations within the resulting NVM system. For a further embodiment, the substrate 102 and the doped region 304 could both be n-type or could both be p-type, if desired.

Figure 4:
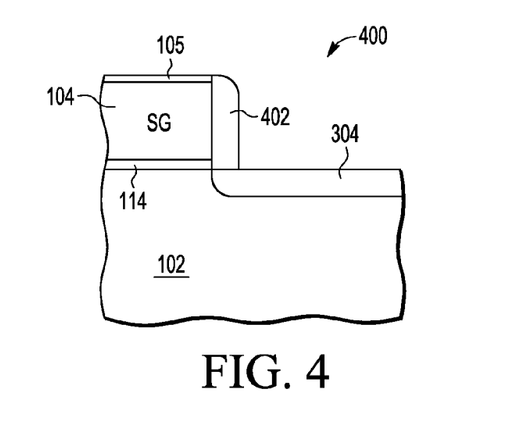
FIG. 4 is a cross-section view of an embodiment after formation of a spacer to protect a portion of the doped region formed by the implant of FIG. 3.

FIG. 4 is a cross-section view of an embodiment 400 after formation of a spacer 402. As depicted, a spacer 402 has been formed adjacent the select gate 104. It is noted that the spacer 402 can be formed, for example, by depositing spacer material, patterning the spacer material, and then performing an etch processing step to form the spacer 402. It is further noted that the spacer material may be nitride, oxide, or some other desired spacer material.

Figure 5:
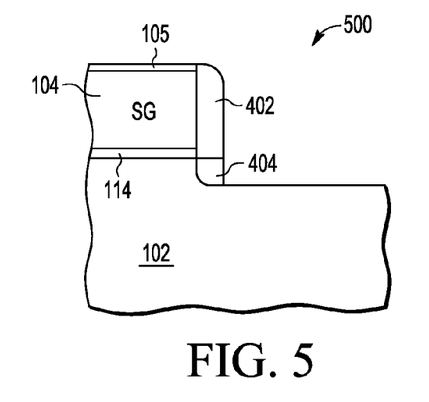
FIG. 5 is a cross-section view of an embodiment after an etch processing step to remove a portion of the doped region not protected by the spacer of FIG. 4.

FIG. 5 is a cross-section view of an embodiment 500 after an etch processing step has occurred to remove a portion of the doped region 304. As depicted, the spacer 402 is used to protect doped region 404 during this etch processing step as it removes a portion of the doped region 304 while leaving the doped region 404. It is noted that the etch may be a timed dry etch processing step that is selective to etch the substrate material. The etch may also be a timed wet etch that is selective to etch the substrate material. Further, a combination of dry and wet selective etches could be used. Further etch processing variations could also be implemented, as desired.

Figure 6:
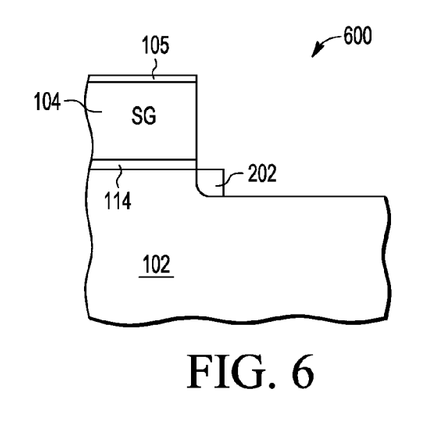
FIG. 6 is a cross-section view of an embodiment after a further spacer etch processing step has been used to remove the spacer and to leave a gap protection zone.

FIG. 6 is a cross-section view of an embodiment 600 after a further spacer etch processing step has occurred to remove the spacer 402. Thus, as depicted, the spacer 402 has been removed using a spacer etch processing step. The resulting doped region provides the gap protection zone 202 for the NVM cell. If desired, the spacer 402 can be etched using an etchant that is selective to the spacer material used to form the spacer 402.

Now looking to FIG. 7, a cross-section view of a further example embodiment 700 is shown where the spacer 402 is not used. Rather, after the implant processing step shown in FIG. 3, an etch processing step is performed to remove a portion of the doped region 304. A heavily doped region is left that provides the gap protection zone 202 for the NVM cell. It is noted that a directional etch processing step can be used for this etch processing step so that the gap protection zone 202 is left after the directional etch processing step even though a spacer 402 is not used. For this embodiment, it is noted that a directional etchant can be utilized to form gap protection zone 202, as the chemical composition of a directional etchant results in different etch rates along different crystallographic orientations in the doped silicon substrate.

FIG. 8 is a cross-section view of a further example embodiment 800 where a doped tail region 802 is also left after the etch processing step of FIG. 5. Thus, as depicted, the etch processing step of FIG. 5 is adjusted so that a tail portion 802 of the doped region 304 is left after the etch processing step. In particular, the duration or timing of the etch processing step is adjusted such that the etch does not completely remove the tail portion 802 of the doped region 304. The spacer 402 can then be removed, as described above, to leave the gap protection zone 202 and the tail portion 802. It is noted that the doped tail portion 802 can further improve performance of the NVM cell during NVM operations.

FIG. 9 is a cross-section view of a further example embodiment 900 where a halo processing step is utilized prior to formation of the doped region 304 in FIG. 3. As depicted, a directional implant is used to form a lightly doped halo region 902 prior to the implant 302 shown in FIG. 3. It is noted that this directional implant processing step can be an ion implant and that the resulting lightly doped halo region 902 preferably has an average impurity content below about $1\times10^{18}$ atoms per cubic centimeter to make the doped halo region 902 a lightly doped region. It is further noted that the doping for this halo region 902 can be a p-type doping, if desired. For example, the ion implant used to create halo region 902 may be a $BF_2$ (boron-fluorine) ion implant with a tilt in the range of 30 to 45 degrees, an energy in the range of 15 to 50 keV, and a dose in the range of $5\times10^{12}$ to $5\times10^{13}$ ions per square centimeter. Boron or indium or another desired p-type dopant may also be used as p-type dopants for this ion implant. It is further noted that halo region 902 has an opposite doping type relative to doped region 304. As such, if doped region 304 is to be formed using p-type dopants, then halo region 902 is formed with n-type dopants.

FIG. 10 is a cross-section view of an example embodiment 1000 after etch processing steps have been applied to the structure of FIG. 9. As depicted, an etch processing step has been used to remove a portion of the heavily doped region 304 to leave the gap protection zone 202, and an etch processing step has also been used to remove portions of the lightly doped halo region 902 to leave the halo zone 1002. As indicated above, one or more etchants that are selective to the doped substrate can be used for these etch processing steps. Further, it is noted that a lightly doped tail region could also be left for the doped halo region 902 similar to the doped tail region 802 shown in FIG. 8, if desired. As described above, to form a tail region 902 the duration or timing of the etch processing step can be adjusted such that the etch leaves a tail portion for the doped region 304.

It is noted that after the gap protection zone 202 has been formed (e.g., as is shown in FIGS. 6, 7, 8, and 10), further processing steps are performed to complete the split-gate NVM cell shown in embodiment 200 of FIG. 2. For example, a charge storage layer is formed over the select gate (SG) 104 and the gap protection zone 202, and the charge storage layer is then patterned and etched to form the charge storage layer 108 for the split-gate NVM cell. A control gate layer can then be formed over the select gate (SG) 104 and the charge storage layer 108, and the control gate layer is then patterned and etched to form the control gate (CG) 106 for the split-gate NVM cell. Similarly, the select gate layer is patterned and etched to form the defined left edge of the select gate (SG) 104 shown in embodiment 200. After the select gate (SG) 104 and the control gate (CG) 106 have been patterned and etched, source/drain extensions are implanted within the substrate 102 adjacent the select gate (SG) 104 and the control gate (CG) 106. Subsequently, spacers 120, 122, and 124 are formed, and then further source/drain implants can be performed to complete the formation of the source region 110 and drain region 112. It is noted that the select gate and the control gate layers can be formed, for example, using a polysilicon deposition processing step to form conductive doped polysilicon. Other conductive materials could also be utilized, if desired. It is further noted that the select-gate dielectric layer 114 may be an oxide layer that is grown or deposited on top of the substrate 102. Other dielectric materials could also be used as the dielectric layer 114, if desired.

In addition to the processing steps described above, it is noted that different and/or additional processing steps could also be utilized, as desired, to form the heavily-doped gap protection zone 202 and/or the other structures shown. Further, other features could be added and/or removed from the split-gate NVM cell while still utilizing a heavily-doped gap protection zone 202, as described herein.

For example, looking now to FIGS. 12-20, example embodiments are provided that are similar to FIGS. 2-10 except that the control gate (CG) is formed prior to the select gate (SG).

Figure 12:
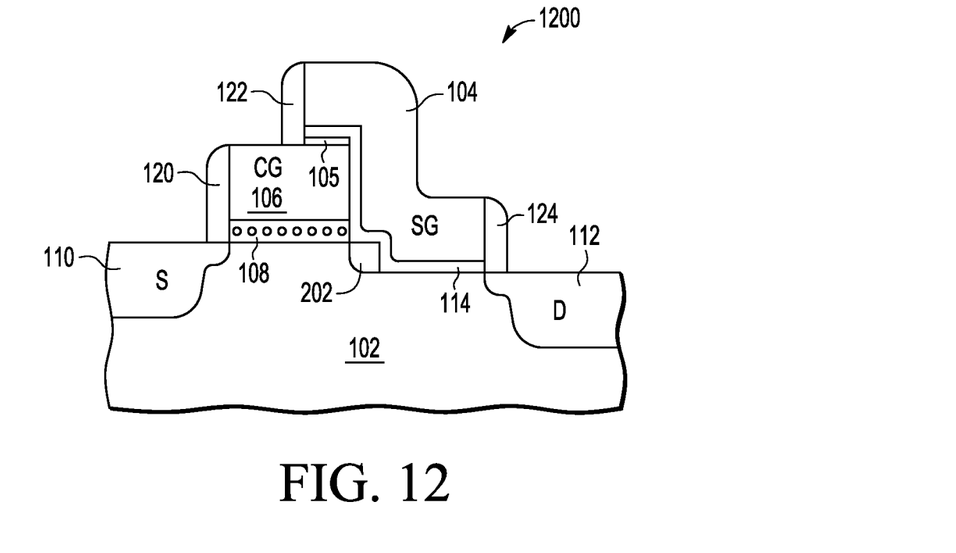
FIG. 12 is a cross-section view of an embodiment for a split-gate NVM cell having a gap protection zone where the control gate is formed prior to the select gate.

FIG. 12 is a cross-section view of an embodiment 1200 for a split-gate NVM cell having a gap protection zone 202 where the control gate (CG) 106 is formed prior to the select gate (SG) 104. As with embodiment 1100 in FIG. 11 (Prior Art), a control gate (CG) 106, a charge storage layer 108, and a select gate (SG) 104 have been formed over a substrate 102 along with control-gate oxide layer 114 and protective nitride layer 105. Source (S) region 110 and drain (D) region 112, as well as spacers 120, 122, and 124, have also been formed. However, unlike embodiment 1100 of FIG. 1 (Prior Art), embodiment 1200 includes a gap protection zone 202, which can be formed using various processing techniques as described herein. As described above, the gap protection zone 202 is preferably a heavily-doped region that provides lower resistance (i.e., improves transconductance), thereby improving performance of the NVM system.

Figure 17:
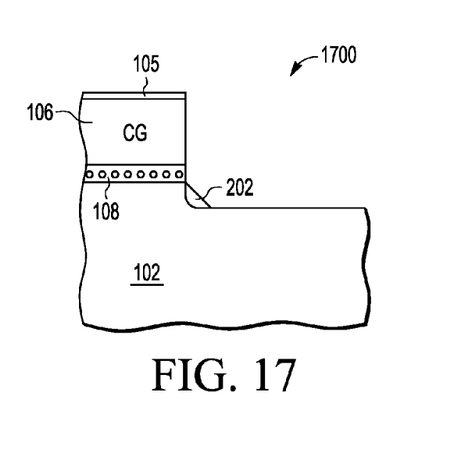
FIGS. 17-20 are cross-section views of a further example embodiments that are similar to FIGS. 7-10 except that the control gate is formed prior to the select gate.
Figure 18:
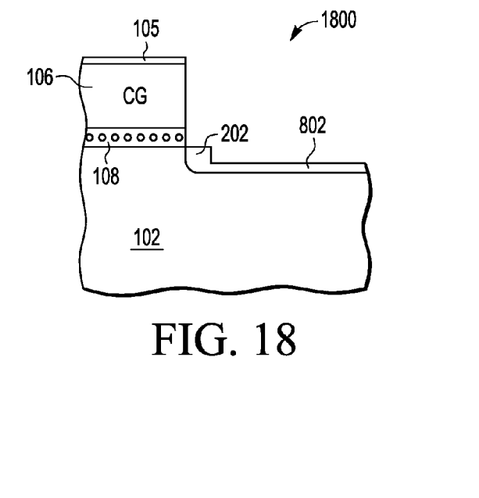

As indicated above, various processing techniques can be utilized to form the gap protection zone 202. Example techniques are now described with respect to FIGS. 13-20. FIGS. 13-16 provide example processing steps using implant, spacer, and etch processing steps to form the gap protection zone 202. FIG. 17 provides a further example embodiment where the spacer is not used. FIG. 18 provides a further example embodiment where a doped tail region is left after the etch processing step. FIGS. 19-20 provide further example processing steps where a halo processing step is utilized prior to formation of the gap protection zone 202.

Figure 13:
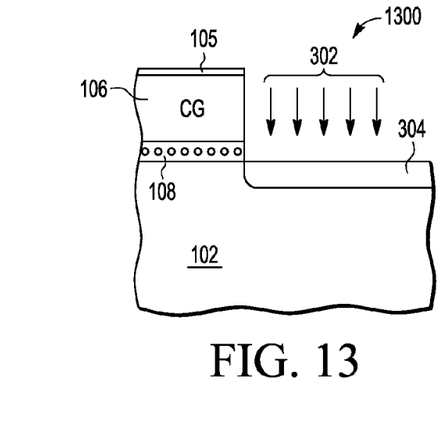
FIGS. 13-16 are cross-section views of embodiments for forming a gap protection zone associated with a split-gate NVM cell that are similar to FIGS. 3-6 except that the control gate is formed prior to the select gate.

Looking now to FIG. 13, a cross-section view is shown of an embodiment 1300 for an implant processing step 302 after formation of a control gate 106 for a split-gate NVM cell. As depicted, the control gate 106 has been formed over substrate 102 along with the charge storage layer 108 and protective nitride layer 105. An implant 302 is used to form a doped region 304 within the substrate 102. As described above, it is noted that the implant processing step can be an ion implant, and it is further noted that the resulting doped region 304 preferably has an average impurity content above about $1\times10^{18}$ atoms per cubic centimeter to make the doped region 304 a heavily doped region. The doped region 304 could also be formed using different and/or additional processing steps, as desired. It is noted that the doping of the doped region 304 and substrate 102 can be implemented as described above with respect to embodiment 300 of FIG. 3.

Figure 14:
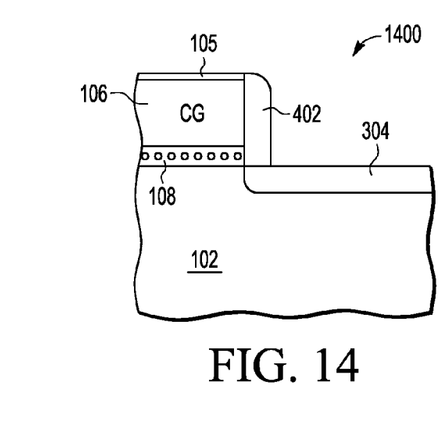

FIG. 14 is a cross-section view of an embodiment 1400 after formation of a spacer 402. As depicted, a spacer 402 has been formed adjacent the control gate 106. It is noted that the spacer 402 can be formed, for example, by depositing spacer material, patterning the spacer material, and then performing a spacer etch processing step to form the spacer 402. It is again noted that the spacer material may be nitride, oxide, or some other desired spacer material.

Figure 15:
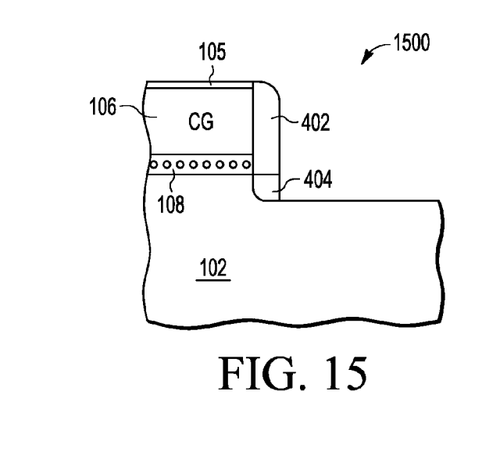

FIG. 15 is a cross-section view of an embodiment 1500 after an etch processing step has occurred to remove a portion of the doped region 304. As depicted, the spacer 402 is used to protect doped region 404 during this etch processing step as it removes a portion of the doped region 304. As noted with respect to FIG. 5 above, the etch may be a timed dry etch processing step that is selective to etch the substrate material. The etch may also be a timed wet etch that is selective to etches the substrate material. Further, a combination of dry and wet selective etches could be used. Further etch processing variations could also be implemented, as desired.

Figure 16:
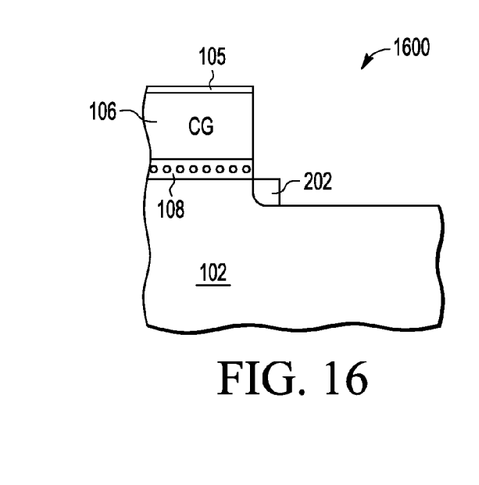

FIG. 16 is a cross-section view of an embodiment 1600 after a further spacer etch processing step has occurred to remove the spacer 402. Thus, as depicted, the spacer 402 has been removed using a spacer etch processing step. The resulting doped region provides the gap protection zone 202 for the NVM cell. As noted above, the spacer 402 can be etched using an etchant that is selective to the spacer material used to form the spacer 402.

Now looking to FIG. 17, a cross-section view of a further example embodiment 1700 is shown where the spacer 402 is not used. Rather, after the implant processing step shown in FIG. 13, an etch processing step is performed to remove a portion of the doped region 304. A heavily doped region is left that provides the gap protection zone 202 for the NVM cell. It is noted that a directional etch processing step can be used for this etch processing step so that the gap protection zone 202 is left after the directional etch processing step even though a spacer 402 is not used. As noted with respect to FIG. 7 above, a directional etchant can be utilized to form gap protection zone 202, as the chemical composition of a directional etchant results in different etch rates along different crystallographic orientations in the doped silicon substrate.

FIG. 18 is a cross-section view of a further example embodiment 1800 where a doped tail region 802 is also left after the etch processing step of FIG. 15. Thus, as depicted, the etch processing step of FIG. 15 is adjusted so that a tail portion 802 of the doped region 304 is left after the etch processing step. In particular, the during or timing of the etch processing step is adjusted such that the etch does not completely remove the tail portion 802 of the doped region 304. The spacer 402 can then be removed, as described above, to leave the gap protection zone 202 and the tail portion 802. It is noted that the doped tail portion 802 can further improve performance of the NVM cell during NVM operations.

FIG. 19 is a cross-section view of a further example embodiment 1900 where a halo processing step is utilized prior to formation of the doped region 304 in FIG. 3. As depicted, a directional implant is used to form a lightly doped halo region 902 prior to the implant 302 shown in FIG. 3. It is noted that this directional implant processing step can be an ion implant and that the resulting lightly doped halo region 902 preferably has an average impurity content below about $1 \times 10^{18}$ atoms per cubic centimeter to make the doped halo region 902 a lightly doped region. It is further noted that the doping for this halo region 902 can be a p-type doping, if desired. As described above, the ion implant used to create halo region 902 may be a $BF_2$ (boron-fluorine) ion implant with a tilt in the range of 30 to 45 degrees, an energy in the range of 15 to 50 keV, and a dose in the range of $5 \times 10^{12}$ to $5 \times 10^{13}$ ions per square centimeter. Boron or indium or another desired p-type dopant may also be used as p-type dopants for this ion implant. It is further noted that halo region 902 has an opposite doping type relative to doped region 304. As such, if doped region 304 is to be formed using p-type dopants, then halo region 902 is formed with n-type dopants.

FIG. 20 is a cross-section view of an example embodiment 2000 after etch processing steps have been applied to the structure of FIG. 9. As depicted, an etch processing step has been used to remove a portion of the heavily doped region 304 to leave the gap protection zone 202, and an etch processing step has been used to remove portions of the lightly doped halo region 902 to leave the halo zone 1002. As indicated above, one or more etchants that are selective to the doped substrate can be used for these etch processing steps. Further, it is noted that a lightly doped tail region could also be left for the doped halo region 902 similar to the doped tail region 802 shown in FIG. 8, if desired. As described above, to form a tail region 902, the duration or timing of the etch processing step can be adjusted such that the etch leaves a tail portion for the doped region 304.

It is noted that after the gap protection zone 202 has been formed (e.g., as is shown in FIGS. 16, 17, 18, and 20), further processing steps are performed to complete the split-gate NVM cell shown in embodiment 1200 of FIG. 12. For example, an oxide layer is formed over the control gate (CG) 106 and the gap protection zone 202, and the oxide layer is then patterned and etched to form the select-gate dielectric layer 114 for the split-gate NVM cell. A select gate layer can then be formed over the control gate (CG) 106 and the dielectric layer 114, and the select gate layer is then patterned and etched to form the select gate (SG) 104 for the split-gate NVM cell. Similarly, the control gate layer is patterned and etched to form the defined left edge of the control gate (CG) 106 shown in embodiment 1200. After the select gate (SG) 104 and the control gate (CG) 106 have been patterned and etched, source/drain extensions are implanted within the substrate 102 adjacent the select gate (SG) 104 and the control gate (CG) 106. Subsequently, spacers 120, 122, and 124 are formed, and then further source/drain implants can be performed to complete the formation of the source region 110 and drain region 112. It is again noted that the select gate and the control gate layers can be formed, for example, using a polysilicon deposition processing step to form conductive doped polysilicon. Other conductive materials could also be utilized, if desired. It is again further noted that the control-gate dielectric layer 114 may be an oxide layer that is grown or deposited on top of the substrate 102. Other dielectric materials could also be used as the dielectric layer 114, if desired.

In addition to the processing steps described above, it is noted that different and/or additional processing steps could also be utilized, as desired, to form the heavily-doped gap protection zone 202 and/or the other structures shown. Further, other features could be added and/or removed from the split-gate NVM cell while still utilizing a heavily-doped gap protection zone 202, as described herein.

As indicated above, FIGS. 21-22 provide block diagrams for connections to a split-gate cell and an NVM system, respectively.

FIG. 21 is a diagram of an embodiment 2100 for wordline driver and column driver connections associated with a split-gate NVM cell 2110 having a heavily-doped gap protection zone, as described herein. For the embodiment depicted, a source voltage ($V_S$) 2114 is provided by a connection to ground 2108. A drain voltage ($V_D$) 2112 is provided by a connection to the column bit-line 2106, which is in turn coupled to column driver circuitry. A control gate voltage ($V_{CG}$) is provided by a connection to a first wordline 2104, and the select-gate voltage ($V_{SG}$) is provided by a connection to a second wordline 2102. The wordline 2102 and wordline 2104 are coupled to wordline driver circuitry.

FIG. 22 is a block diagram of an embodiment for a split-gate NVM system 2200 including a memory cell array 2202 having a plurality of split-gate NVM cells 2110, each having a heavily-doped gap protection zone, as described herein. The split-gate NVM cell array 2202 is coupled to wordline (WL) driver circuitry 2208, which provides select-gate and control-gate wordline voltages to the split-gate NVM cells 2210 within the memory cell array 2202. The split-gate NVM cell array 2202 is also coupled to column driver circuitry 2204. For read and verify operations, the column driver circuitry 2204 determines charge levels stored in selected NVM cells within the array 2202 and outputs related data to an input/output (I/O) interface 2206. For program and erase operations, the column driver circuitry 2204 provides program/erase voltage levels to selected NVM cells within the array 2202. Control circuitry 2210 provides control signals to the wordline (WL) driver circuitry 2208, the column driver circuitry 2204, the NVM cell array 2202, and the I/O interface 2206. It is further noted that the array of split-gate NVM cells 2202, the wordline driver circuitry 2208, the column driver circuitry 2204, the control circuitry 2210, and/or the I/O interface 2206 can be integrated within a single integrated circuit. It is further noted that the input/output (I/O) output data channel 2212 coupled to the I/O interface 2206 can be used internally within an integrated circuit or can be used to communicate data externally from the integrated circuit within which the split-gate NVM system 2200 is integrated, as desired.

As described herein, a variety of embodiments can be implemented and different features and variations can be implemented, as desired.

Embodiments are disclosed here for a method for forming a non-volatile memory (NVM) cell having a gap protection zone including forming a gate for a split-gate non-volatile memory (NVM) cell over a substrate, forming a doped region within the substrate adjacent the gate, and removing a first portion of the doped region to leave a second portion of the doped region where the second portion providing a gap protection zone region adjacent the gate. In further embodiments, the gate is a select gate, and the method further includes forming a charge storage layer adjacent the select gate and at least in part over the gap protection zone region, and also forming a control gate adjacent the charge storage layer such that the gap protection zone region is located within the substrate between the control gate and the select gate. In other further embodiments, the gate is a control gate formed on top of a charge storage layer, and the method further includes forming a dielectric layer adjacent the control gate and at least in part over the gap protection zone region, and also forming a select gate adjacent the dielectric layer such that the gap protection zone region is located within the substrate between the select gate and the control gate. Further, the gap protection zone region can have an average doping concentration of above about $1\times10^{18}$ atoms per cubic centimeter. In addition, the gap protection zone region can be formed using an ion implant having an energy range of 1 to 10 keV (kilo-electron volt) and a dose of $1\times10^{13}$ to $1\times10^{14}$ atoms per square centimeter.

In addition, embodiments are disclosed where the method includes forming a spacer adjacent the gate to protect the gap protection zone region during the removing step. Further, the removing step can include an etch processing step where the spacer protects the gap protection zone region during the etch processing step, and the method can further include removing the spacer with a spacer etch processing step. For other embodiments, the removing step can include a directional etch processing step, and no spacer is utilized to protect the gap protection zone region during the directional etch processing step. Still further, the removing step can leave a tail portion of the doped region extending laterally from the gap protection zone region and having a thickness less than the gap protection zone region. For still further embodiments, the method further can include forming a halo doped region adjacent the gate using a directional implant processing step where the halo doped region is deeper than the gap protection zone region, has a lower doping concentration than the gap protection zone region, and has an opposite dopant type from the gap protection zone region. In addition, the halo doped region can have an average doping concentration of below about $1\times10^{18}$ atoms per cubic centimeter, and the gap protection zone region can have an average doping concentration of above about $1\times10^{18}$ atoms per cubic centimeter.

In further embodiments, the gap protection zone region can be a doped monocrystalline material. Further, the substrate can have a first dopant type and the gap protection zone region can have a second opposite dopant type. Also, the substrate can have a first dopant type and gap protection zone region can have the same dopant type. Still further, the gap protection zone region can be located adjacent only one edge of the gate.

Embodiments are also disclosed herein for a split-gate non-volatile memory (NVM) cell having a gap protection zone region including a substrate, a select gate and a control gate positioned over the substrate, an intervening layer at least in part positioned between the select gate and control gate, and a gap protection zone region located at least in part under the intervening layer between the select gate and the control gate where the gap protection zone region is a doped semiconductor material within the substrate. In further embodiments, the intervening layer is a charge storage layer, and the control gate is positioned at least in part over the select gate. In other further embodiments, the intervening layer is a dielectric layer, and the select gate is positioned at least in part over the control gate. Further, the gap protection zone region can have an average doping concentration of above about $1\times10^{18}$ atoms per cubic centimeter.

In additional embodiments, the split-gate NVM cell further includes a doped tail portion extending laterally from the gap protection zone region and having a thickness less than the gap protection zone region, and the doped tail portion further has a doping concentration and dopant type matching the gap protection zone region. Still further, the split-gate NVM cell can include a halo doped region adjacent the select gate, and the halo doped region can be deeper than the gap protection zone region, have a lower doping concentration than the gap protection zone region, and have an opposite dopant type from the gap protection zone region.

In further embodiments, the substrate has a first dopant type and the gap protection zone region has a second opposite dopant type. Further, the substrate can have a first dopant type and gap protection zone region can have a same dopant type.

Embodiments are also disclosed for that have the split-gate NVM cell repeated to form an array of split-gate NVM cells for an NVM system. Further, the NVM system includes wordline driver circuitry coupled to the plurality of split-gate NVM cells and column driver circuitry coupled to the plurality of split-gate NVM cells. In addition, the NVM cells, the wordline driver circuitry, and the column driver circuitry are integrated within a single integrated circuit.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A method for forming a non-volatile memory (NVM) cell having a gap protection zone, comprising:
    forming a gate for a split-gate non-volatile memory (NVM) cell over a substrate;
    forming a doped region within the substrate adjacent the gate using at least one of a p-type dopant or an n-type dopant; and
    removing a first portion of the doped region to leave a second portion of the doped region within the substrate adjacent the gate, the second portion providing a gap protection zone region;
    wherein before the forming a doped region step, the method further comprises forming a halo doped region adjacent the gate using a directional implant processing step, the halo doped region being deeper than the gap protection zone region, having a lower doping concentration than the gap protection zone region, and having an opposite dopant type from the gap protection zone region.

2. The method of claim 1, wherein the gate is a select gate, and further comprising forming a charge storage layer adjacent the select gate and at least in part over the gap protection zone region, and also forming a control gate adjacent the charge storage layer such that the gap protection zone region is located within the substrate between the control gate and the substrate below the select gate.

3. The method of claim 1, wherein the gate is a control gate formed on top of a charge storage layer, and further comprising forming a dielectric layer adjacent the control gate and at least in part over the gap protection zone region, and also forming a select gate adjacent the dielectric layer such that the gap protection zone region is located within the substrate between the select gate and the substrate below the control gate.

4. The method of claim 1, wherein once formed, the gap protection zone region comprises an average doping concentration of above about $1\times10^{18}$ atoms per cubic centimeter.

5. The method of claim 1, wherein the gap protection zone region is formed using an ion implant having an energy range of 1 to 10 keV (kilo-electron volt) and a dose of $1\times10^{13}$ to $1\times10^{14}$ atoms per square centimeter.

6. The method of claim 1, wherein after the forming steps and prior to the removing step, the method further comprises forming a spacer adjacent the gate to protect the gap protection zone region during the removing step.

7. The method of claim 6, wherein the removing step comprises an etch processing step, and wherein the spacer protects the gap protection zone region during the etch processing step, and further comprising removing the spacer with a spacer etch processing step.

8. The method of claim 1, wherein the removing step comprises a directional etch processing step, and wherein no spacer is utilized to protect the gap protection zone region during the directional etch processing step.

9. The method of claim 1, wherein the removing step also leaves a tail portion of the doped region extending laterally from the gap protection zone region and having a thickness less than the gap protection zone region.

10. The method of claim 1, wherein the halo doped region comprises an average doping concentration of below about $1\times10^{18}$ atoms per cubic centimeter, and wherein the gap protection zone region comprises an average doping concentration of above about $1\times10^{18}$ atoms per cubic centimeter.

11. The method of claim 1, wherein the gap protection zone region is located adjacent only one edge of the gate.

12. The method of claim 1, wherein the gap protection zone region is a doped monocrystalline material.

13. The method of claim 1, wherein the substrate has a first dopant type and the gap protection zone region has a second opposite dopant type.

14. The method of claim 1, wherein substrate has a first dopant type and gap protection zone region has a same dopant type.

* * * * *